United States Patent
Roh et al.

(10) Patent No.: US 7,262,810 B2
(45) Date of Patent: Aug. 28, 2007

(54) TELEVISION-WATCHABLE REFRIGERATOR SYSTEM AND METHOD FOR OPERATING THE SAME

(75) Inventors: Young Hoon Roh, Seoul (KR); Jung Ho Kim, Seoul (KR); Jin Cheol Cho, Seoul (KR); Jae Won Chang, Seoul (KR); Sang Hyuk Kang, Pusan (KR); Sang Mahn Kim, Kyunggi-do (KR); Pan Su Kim, Kyunggi-do (KR)

(73) Assignee: LG Electronic Inc., Seoul (KR)

( * ) Notice: Subject to any disclaimer, the term of this patent is extended or adjusted under 35 U.S.C. 154(b) by 788 days.

(21) Appl. No.: 10/677,306

(22) Filed: Oct. 3, 2003

(65) Prior Publication Data

US 2004/0070696 A1  Apr. 15, 2004

(30) Foreign Application Priority Data

Oct. 10, 2002 (KR) .................. 10-2002-0061863

(51) Int. Cl.
*H04N 7/00* (2006.01)
*H04N 5/64* (2006.01)

(52) U.S. Cl. .................. 348/552; 348/553; 62/127; 62/126; 725/81; 725/133

(58) Field of Classification Search .............. 348/552, 348/553, 836; 62/126, 127; 710/8, 15; 455/151.2, 555; 345/156, 169; 725/81, 725/78, 133, 141, 153

See application file for complete search history.

(56) References Cited

U.S. PATENT DOCUMENTS

| | | | | |
|---|---|---|---|---|
| 6,327,576 B1 * | 12/2001 | Ogasawara | .................. | 705/22 |
| 6,393,848 B2 * | 5/2002 | Roh et al. | ...................... | 62/126 |
| 6,502,411 B2 * | 1/2003 | Okamoto | ...................... | 62/129 |
| 6,622,169 B2 * | 9/2003 | Kikinis | ........................ | 709/220 |
| 6,644,046 B2 * | 11/2003 | Roh et al. | ...................... | 62/126 |
| 6,692,093 B1 * | 2/2004 | Park et al. | ............... | 312/405.1 |
| 6,722,146 B2 * | 4/2004 | Roh et al. | ...................... | 62/231 |
| 6,862,460 B2 * | 3/2005 | Safadi | ...................... | 455/553.1 |
| 6,982,640 B2 * | 1/2006 | Lindsay et al. | ............. | 340/540 |
| 7,039,190 B1 * | 5/2006 | Engwer et al. | ............. | 380/270 |
| 7,050,991 B2 * | 5/2006 | Ogasawara | .................. | 705/22 |
| 7,090,141 B2 * | 8/2006 | Roh et al. | ...................... | 236/51 |

(Continued)

FOREIGN PATENT DOCUMENTS

EP          1016960          7/2000

*Primary Examiner*—David Ometz
*Assistant Examiner*—Jean W. Désir
(74) *Attorney, Agent, or Firm*—Greenblum & Bernstein, P.L.C.

(57) ABSTRACT

A television-watchable refrigerator system and a method for operating the same. A Web pad is detachably mounted on the outer surface of a refrigerator and a television (TV) module or TV antenna module is provided to receive a television signal and wirelessly transmit the received television signal to the Web pad, thereby removing a need for wiring to provide a wired connection of the refrigerator with a television antenna terminal. The TV module or TV antenna module is connected with a television set or television antenna terminal to receive a television signal therefrom and wirelessly transmit the received television signal to the Web pad. The Web pad is detachably mounted on the outer surface of the refrigerator to wirelessly receive the television signal from the TV module or TV antenna module and display it.

17 Claims, 5 Drawing Sheets

U.S. PATENT DOCUMENTS 7,126,569 B2 * 10/2006 Ootsuka et al. ................ 345/87
7,130,719 B2 * 10/2006 Ehlers et al. ................ 700/276
7,136,940 B2 * 11/2006 Roh et al. ...................... 710/8
2001/0010516 A1 * 8/2001 Roh et al. .................... 345/169
2001/0021998 A1 * 9/2001 Margulis ..................... 725/81
2002/0157411 A1 * 10/2002 Ishikawa et al. .............. 62/231

* cited by examiner

TELEVISION-WATCHABLE REFRIGERATOR SYSTEM AND METHOD FOR OPERATING THE SAME

RELATED APPLICATIONS

The present disclosure relates to subject matter contained in Korean Application No. 10-2002-0061863, filed on Oct. 10, 2002, which is expressly incorporated herein by reference it its entirety.

BACKGROUND OF THE INVENTION

1. Field of the Invention

The present invention relates to a television-watchable refrigerator system and a method for operating the same. More particularly, the present invention relates to a television-watchable refrigerator system and a method for operating the same, wherein a Web pad is detachably mounted on the outer surface of a refrigerator and a television (TV) module or TV antenna module is provided to receive a television signal and wirelessly transmit the received television signal to the Web pad. The present invention thus eliminates a need for providing wiring for a wired connection of the refrigerator with television antenna terminal and overcoming limitations in installation locations of the refrigerator resulting from the need for a wired connection.

2. Description of the Related Art

Generally, refrigerators are home appliances that have inner compartments for storage of food, which are insulated from the external environment to maintain the stored food at a low temperature and preserve it from spoilage and decay so as to keep it in a fresh state for a long time.

Recently, a refrigerator has been developed which has a display unit, a key input unit, a processor for signal processing, etc. to perform a general computer function in a kitchen, in addition to the above-mentioned basic refrigeration function. In particular, such a refrigerator is provided with Internet access devices, such as a local area network (LAN) card and a cable modem, to additionally perform a function of gaining access to an external Internet network. As a result, a user can not only upload/download data to/from a Web page connected over the Internet network, but can also search the connected Web page for desired data.

In the case where a home network is constructed in a building and a plurality of home appliances are connected to the home network, the above-described refrigerator can be used as a home server for centrally controlling the plurality of home appliances. The reason that the refrigerator is used as a home server is that the refrigerator is generally always in its driven or "ON" state, so it is capable of monitoring, in real time, variations in the states of the home appliances connected to the home network.

To this end, the above refrigerator includes, as shown in FIG. 1, display 20, such as a plasma display panel (PDP) or liquid crystal display (LCD), mounted on the outer front surface of the refrigerator R for displaying the state of the refrigerator R externally and performing an input/output operation in a touch pad manner to enable the user to input commands. As a result, the user can confirm the internal conditions of the refrigerator R and data transmitted and received to/from the connected Web page through the display means 20.

In addition, provided that the refrigerator R is equipped with a TV reception card, it will be able to output a television picture (i.e. a video image) through the display 20, thereby enabling the user to watch television in the kitchen.

As shown in FIG. 1, the conventional television-watchable refrigerator R further includes a television reception control unit 10 mounted on the top surface of the refrigerator R for controlling the reception of a television signal and of the television watching. The display 20 is fixedly mounted on the outer surface of the refrigerator R and internally connected with the television reception control unit 10 in a wired manner to receive and display a television signal.

The television reception control unit 10 is connected with a television antenna terminal 4, which is typically installed on a wall in the building, via a cable, to receive a television signal from the television antenna terminal 4, as shown in FIG. 1.

The television reception control unit 10 is operated in the following manner to display a television signal through the conventional television-watchable refrigerator R. First, the user inputs a desired channel and television control command through a key input unit (not shown) mounted on the outer surface of the refrigerator R. Then, the television reception control unit 10 receives a television signal of the desired channel from the television antenna terminal 4 in response to the television control command. Thereafter, the television reception control unit 10 separates the received television signal into an audio signal and a video signal and transfers the separated audio and video signals to the display 20 to output them externally.

In the above-mentioned conventional television-watchable refrigerator R, the television reception control unit 10 is mounted integrally with the refrigerator R and connected via the cable with the television antenna terminal 4 which sends a television signal to the control unit 10. For this reason, the refrigerator R must be positioned in the vicinity of the television antenna terminal 4.

If that the refrigerator R is located far away from the television antenna terminal 4, the cable will have to be extended to the place where the refrigerator R is installed, so it (the cable) will be exposed externally. This provides an aesthetically unappealing sight, resulting in a limitation in places suitable for installation of the refrigerator R.

Moreover, in an old house or apartment, the television antenna terminal 4 may be limitedly installed in a parlor or living room. In this case, the user cannot use the television watching function in the kitchen where the refrigerator is located, thereby reducing its utility.

SUMMARY OF THE INVENTION

Therefore, the present invention has been made in view of and to overcome the above problems. It is an object of the present invention to provide a television-watchable refrigerator system and a method for operating the same, wherein a Web pad is detachably mounted on the outer surface of a refrigerator and a TV module or TV antenna module is provided to receive a television signal from a television set or television antenna terminal and wirelessly transmit the received television signal to the Web pad, so that the television signal can be displayed through the Web pad.

In accordance with one aspect of the present invention, the above and other objects can be accomplished by the provision of a television-watchable refrigerator system comprising a Web pad detachably mounted on an outer surface of a refrigerator, the Web pad receiving a refrigerator or television control command inputted by a user; a refrigerator control unit for displaying a controlled result based on the refrigerator control command through the Web pad and controlling the entire operation of the refrigerator; and a television module connected with a television set, the television module receiving a television signal corresponding to the television control command from the television set, wirelessly transmitting the received television signal to the Web pad so that it can be displayed through the Web pad, and transferring the television control command inputted through the Web pad to the television set.

In accordance with another aspect of the present invention, there is provided a television-watchable refrigerator system comprising a Web pad detachably mounted on an outer surface of a refrigerator, the Web pad receiving a refrigerator or television control command inputted by a user; a refrigerator control unit for displaying a controlled result based on the refrigerator control command through the Web pad and controlling the entire operation of the refrigerator; and a television antenna module connected to a television antenna terminal, the television antenna module receiving a television signal from the television antenna terminal, tuning to the received television signal in response to the television control command inputted through the Web pad and wirelessly transmitting the tuned television signal to the Web pad.

In accordance with yet another aspect of the present invention, there is provided a method for operating a television-watchable refrigerator system, comprising the steps of a) detachably mounting a Web pad on an outer surface of a refrigerator and inputting a refrigerator or television control command through the Web pad; b) receiving a television signal from a television set or television antenna terminal in response to the television control command inputted at the step a) and wirelessly transmitting the received television signal to the Web pad; c) performing a signal separation/decoding operation with respect to the television signal wirelessly transmitted at the step b) so that it can be displayed through the Web pad; and d) displaying the resulting television signal at the step c) through the Web pad.

BRIEF DESCRIPTION OF THE DRAWINGS

The above and other objects, features and other advantages of the present invention will be more clearly understood from the following detailed non-limiting description taken in conjunction with the accompanying drawings, in which.

DESCRIPTION OF THE PREFERRED EMBODIMENTS

The basic construction of the present invention will hereinafter be described with reference to FIG. 2 which shows the outer appearance of a television-watchable refrigerator in accordance with the present invention.

Figure 1:
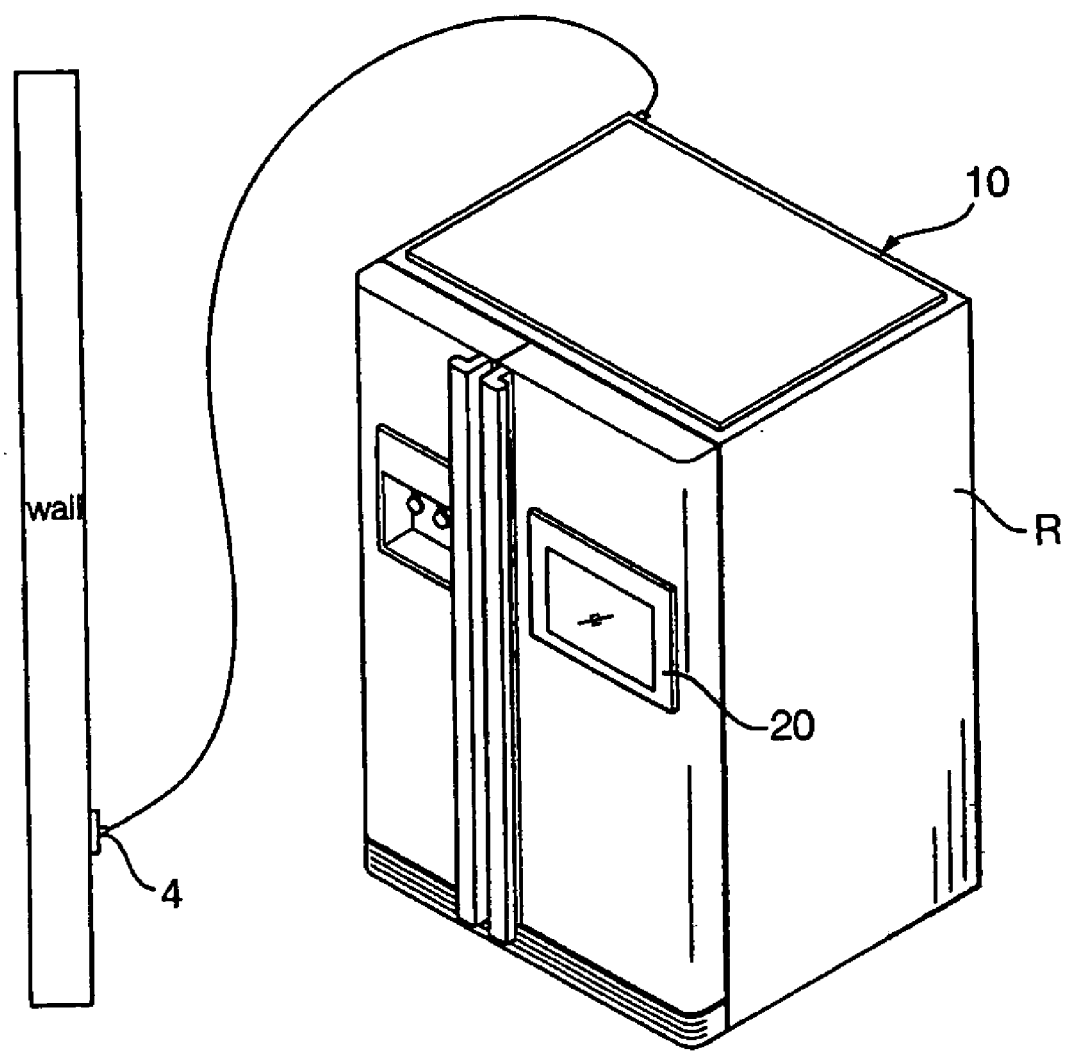
FIG. 1 is a perspective view showing the installation of a conventional television-watchable refrigerator.
Figure 2:
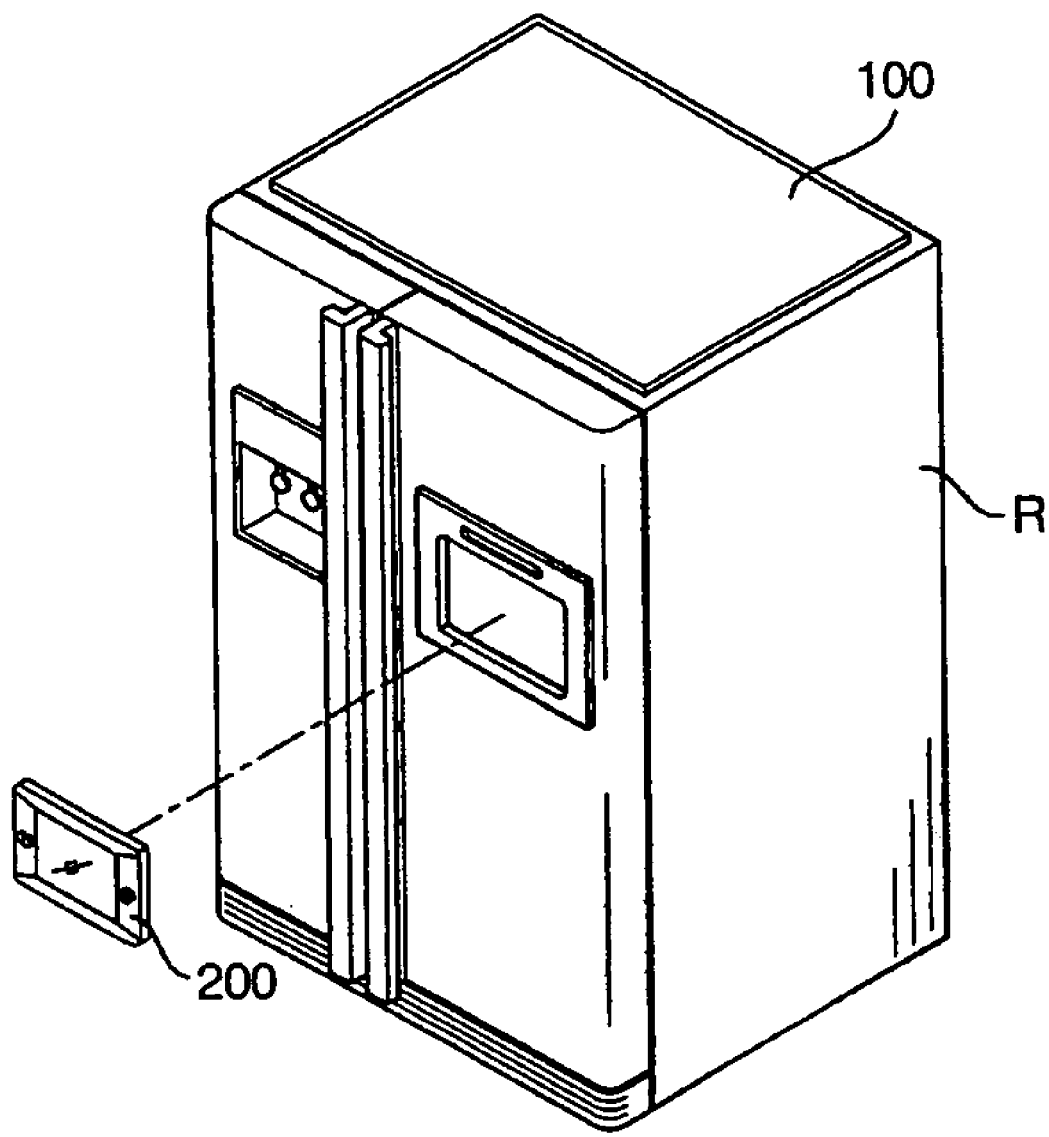
FIG. 2 is a perspective view showing the outer appearance of a television-watchable refrigerator in accordance with the present invention.

A Web pad 200 is detachably mounted on the outer surface of the refrigerator R, preferably on the outer surface of a door of the refrigerator R, as shown in FIG. 2.

The Web pad 200 is preferably a personal digital assistant (PDA) for receiving a user's command inputted in a touch screen manner on its liquid crystal (display) screen of a predetermined size and performing a variety of functions, such as E-mail transmission/reception, word processing, an electronic book, etc., which is typically called a tablet personal computer (PC).

The Web pad 200 is equipped with a wireless communication module based on a wireless LAN protocol, which is a wireless communication protocol recently developed to enable wireless communication within a certain distance. The wireless communication module enables the Web pad 200 to be wirelessly networked with peripheral devices within a maximum range of about 100 meters. Of course, the wireless communication module is based on other protocols, e.g., having different ranges.

In other words, the Web pad 200 is detachably mounted on the refrigerator R, and wirelessly transmits and receives signals to/from the refrigerator R even while being detached from the refrigerator R. As a result, the Web pad 200 wirelessly transmits a control command input by the user from within a certain distance to the refrigerator R. Further the Web pad 200 wirelessly receives controlled result information based on the control command from the refrigerator R and displays the received information.

Figure 3:
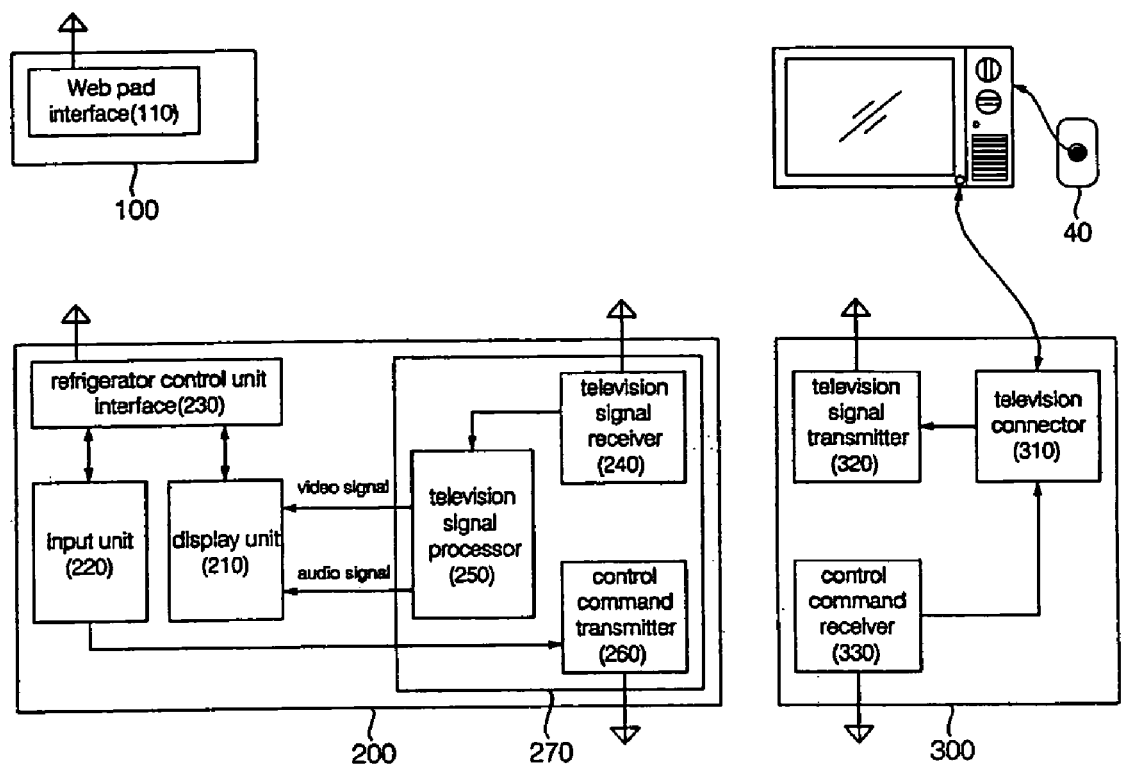
FIG. 3 is a block diagram showing a preferred embodiment of a television-watchable refrigerator system in accordance with the present invention.
Figure 4:
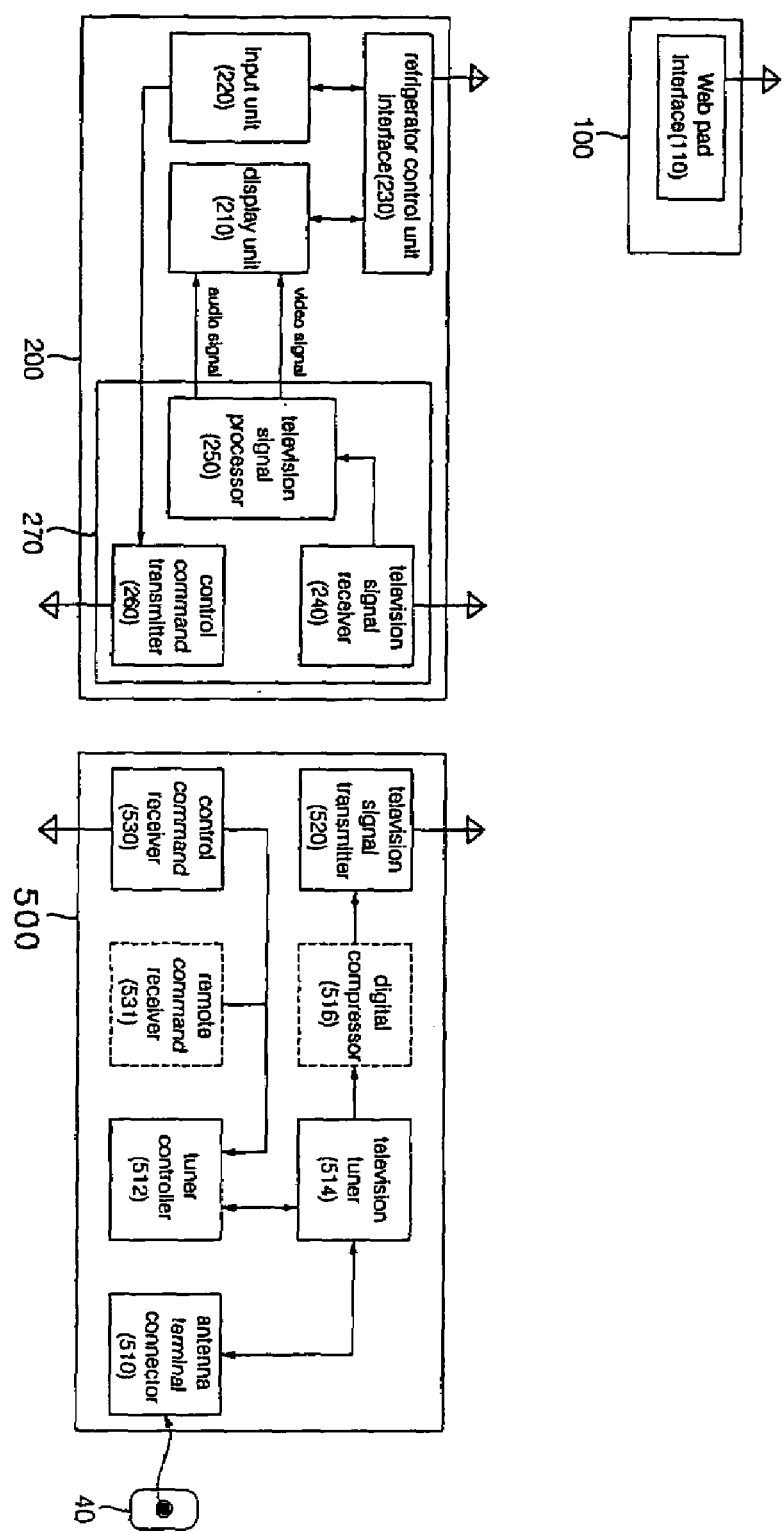
FIG. 4 is a block diagram showing an alternative embodiment of the television-watchable refrigerator system in accordance with the present invention.

FIG. 3 is a block diagram showing a preferred embodiment of a television-watchable refrigerator system in accordance with the present invention, and FIG. 4 is a block diagram showing an alternative embodiment of the television-watchable refrigerator system in accordance with the present invention. In the first embodiment, a TV module 300 is connected to a television set to receive a television signal from the television set, process the received television signal and wirelessly transmit the processed result to the Web pad 200. In the second embodiment, a TV antenna module 500 is connected directly to a television antenna terminal 40 to receive a television signal from the television antenna terminal 40, process the received television signal and wirelessly transmit the processed result to the Web pad 200.

Accordingly, the TV module 300 or TV antenna module 500 is disposed in the vicinity of the television set or television antenna terminal 40 to receive a television signal from the television set or television antenna terminal 40, process the received television signal and wirelessly transmit the processed result to the Web pad 200 so that the television signal can be displayed through a display unit 210 of the Web pad 200. This can overcome limitations in locations for installation of the refrigerator R.

The television-watchable refrigerator R typically has display mounted on its outer surface for outputting video and audio signals and receiving a command inputted by the user via a touch pad or keypad or any other suitable input device. In the first and second embodiments of the present invention, the Web pad 200 is employed as the display. The Web pad 200 is a mobile wireless computer which has a wireless communication module to transmit and receive data and access the Internet at any place. As shown in FIG. 2, the Web pad 200 is detachably mounted on the outer surface of the refrigerator R. The Web pad 200 is also adapted to receive a television control command for television watching and display a television signal.

A refrigerator control unit 100 is provided to control the entire operation of the refrigerator, to execute the user's control commands for an Internet access function and home server function as well as for storage and refrigeration of food. The refrigerator control unit 100 is also adapted to generate controlled result information based on the user's control commands and wirelessly transmit the generated information to the Web pad 200 so that the user can monitor the execution results of the control commands through the Web pad 200.

The refrigerator control unit 100 includes a Web pad interface 110 for performing wireless communication with the Web pad 200 according to, e.g., an 802.11b wireless communication protocol or another suitable wireless communication protocol.

The Web pad 200 includes a display unit 210 for outputting video and audio signals externally, and an input unit 220 for receiving a control command inputted by the user. The input unit 220 is preferably provided with a separate keypad for key input. Alternatively, the input unit 220 may form a touch pad with the display unit 210. Other input unit embodiments are, of course, within the scope of the present invention.

The Web pad 200 is adapted and configured to wirelessly transmit the user's control command, input through the input unit 220, to the refrigerator control unit 100 such that the refrigeration associated function, Internet access function or home server function is performed according to the user's control command. The Web pad 200 is also adapted and configured to wirelessly receive controlled result information from the refrigerator control unit 100 and display the received information through the display unit 210 thereof. To this end, the Web pad 200 further includes a refrigerator control unit interface 230 for performing wireless communication with the refrigerator control unit 100 according to, e.g., the 802.11b wireless communication protocol.

The user can input a television control command as well as a refrigeration associated control command by operating the input unit 220 of the Web pad 200. To this end, the Web pad 200 further includes a wireless communication interface 270 for wirelessly transmitting a television control command input through the input unit 220 to the TV module 300 or TV antenna module 500 and wirelessly receiving a television signal from the TV module 300 or TV antenna module 500. The wireless communication interface 270 also functions to perform a signal separation/decoding operation with respect to the received television signal so that it can be displayed through the Web pad 200.

The display unit 210 acts to display the controlled result information wirelessly received by the refrigerator control unit interface 230 and the television signal wirelessly received by the wireless communication interface 270.

The wireless communication interface 270 includes a television signal receiver 240 for receiving a television signal wirelessly transmitted from the TV module 300 or TV antenna module 500, a television signal processor 250 for decoding the television signal received by the television signal receiver 240 to separate it into a video signal, more particularly a composite video signal, and an audio signal to transfer the separated video and audio signals to the display unit 210. A control command transmitter 260 is also provided for wirelessly transmitting a television control command input through the input unit 220 to the TV module 300 or TV antenna module 500.

Preferably, the television-watchable refrigerator system according to the present invention may further comprise a remote controller for remotely inputting a television control command. In this case, the control command transmitter 260 receives the television control command inputted by the remote controller and wirelessly transmits it to the TV module 300 or TV antenna module 500.

The television signal receiver 240 of the Web pad 200 is adapted and configured to wirelessly receive a television signal from the TV module 300 or TV antenna module 500 at a high frequency of about 2.4 GHz, and the control command transmitter 260 of the Web pad 200 is adapted and configured to wirelessly transmit a television control command to the TV module 300 or TV antenna module 500 at a low frequency of 400 to 900 MHz.

A time delay may occur in a television signal consisting of video and audio signals during its wireless transmission because the television signal is large. In this regard, in order to transmit the television signal in real time, it is preferable that the television signal receiver 240 and a television signal transmitter 320, to be described below, utilize a high frequency where a transfer capacity per unit time is large.

In the first embodiment, the TV module 300 includes a television connector 310 for receiving a television signal from the television set, a television signal transmitter 320 for wirelessly transmitting the television signal received by the television connector 310 to the Web pad 200, and a control command receiver 330 for receiving a television control command wirelessly transmitted from the control command transmitter 260 of the Web pad 200 and transferring the received television control command to the television set.

In the second embodiment, the TV antenna module 500, which is connected directly to the television antenna terminal 40, is used instead of the TV module 300 in the first embodiment. Except for this point, the refrigerator control unit 100 and Web pad 200 in the second embodiment are the same in construction as those in the first embodiment and a description thereof will thus be omitted.

As shown in FIG. 4, the TV antenna module 500 has a television tuner 514 and is adapted to receive a television control command for channel change or etc. directly from the remote controller or Web pad 200. The TV antenna module 500 is also adapted to wirelessly transmit a tuned television signal to the Web pad 200 at the frequency of 2.4 GHz.

The TV antenna module 500 includes an antenna terminal connector 510 connected directly to the television antenna terminal 40 for receiving a television signal therefrom, and a control command receiver 530 for wirelessly receiving a television control command from the Web pad 200. The television tuner 514 acts to tune a television signal to select a channel corresponding to the television control command received by the control command receiver 530. The TV antenna module 500 further includes a television signal transmitter 520 for wirelessly transmitting the television signal tuned by the television tuner 514 to the Web pad 200.

The TV antenna module 500 further includes a tuner controller 512 for controlling the television tuner 514 in response to the television control command received by the control command receiver 530 such that the television tuner 514 performs its tuning operation based on the television control command.

Preferably, the TV antenna module 500 may further include a remote command receiver 531 and a digital compressor 516, as indicated by dotted lines in FIG. 4.

The remote command receiver 531 acts to directly receive a television control command transmitted from the remote controller, which is capable of remotely inputting all commands for television watching, and transfer the received television control command to the tuner controller 512 so that a channel corresponding thereto can be selected.

The digital compressor 516 acts to compress/encode the television signal tuned by the television tuner 514 so that it can be wirelessly transmitted to the Web pad 200 in real time without a data loss or damage resulting from a time delay during its wireless transmission.

A television signal processor 250' is provided in the Web pad 200 to decode the compressed television signal wirelessly transmitted from the TV antenna module 500 so that it can be displayed through the display unit 210.

Therefore, in the television-watchable refrigerator system according to the second embodiment of the present invention, the digital compressor 516, such as a moving picture experts group (MPEG) compressor, is further provided in the TV antenna module 500 to enhance the speed of wireless transmission to the Web pad 200. The remote command receiver 531 is further provided in the TV antenna module 500 to directly receive a television control command transmitted from the remote controller, which is capable of remotely inputting all commands for television watching, and transfer the received television control command to the tuner controller 512. This enhances the convenience of use of the device.

Figure 5:
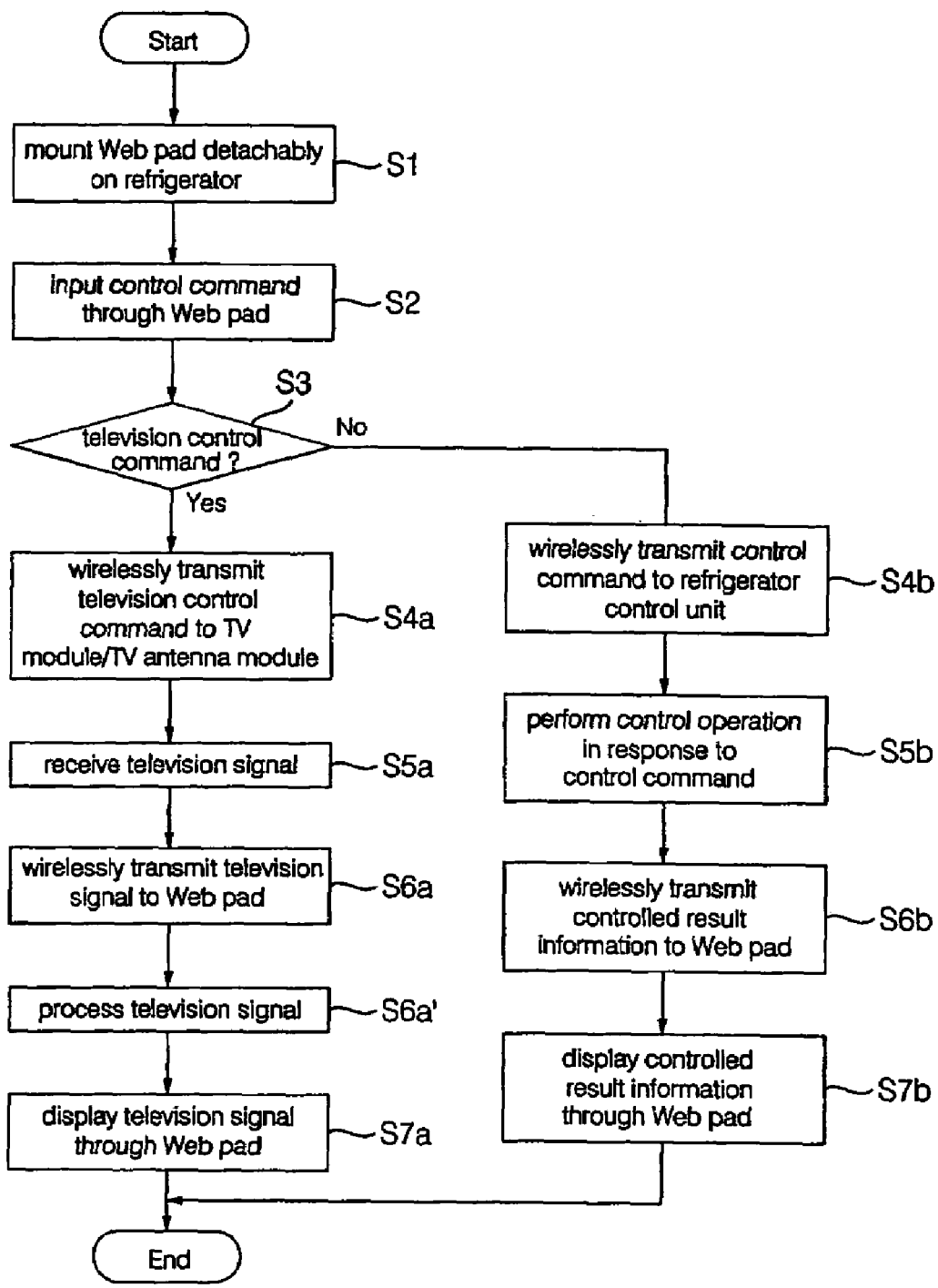
FIG. 5 is a flow chart illustrating the operation of the television-watchable refrigerator system in accordance with the present invention.

Next, a description will be given of the operation of the television-watchable refrigerator system with the above-stated construction in accordance with the present invention with reference to a flow chart of FIG. 5.

First, the Web pad is detachably mounted on the outer surface of the refrigerator (S1).

Then, a control command is input through the Web pad irrespective of whether the Web pad is attached to or detached from the refrigerator (S2).

Preferably, control commands can be roughly classified into a refrigeration associated control command to be executed by the refrigerator control unit and a television control command to be executed by the TV module or TV antenna module. The refrigeration associated control command can include control commands for an Internet access function, home server function and so forth as well as related to food storage.

The Web pad determines whether the input control command is a television control command (S3). If the input control command is determined to be a television control command, then the Web pad wirelessly transmits the television control command to the TV module or TV antenna module (S4a).

The TV module or TV antenna module receives a television signal of a channel corresponding to the television control command (S5a) and wirelessly transmits the received television signal to the Web pad (S6a). At this time, provided that the received television signal is large, it will be compressed.

The Web pad wirelessly receives the television signal, decodes the received television signal to decompress it, and separates the resulting television signal into a video signal and an audio signal (S6a').

Thereafter, the separated video and audio signals are externally outputted so that the user can watch television in real time (S7a).

On the other hand, upon determining at step S3 that the inputted control command is not a television control command, the Web pad wirelessly transmits the inputted control command to the refrigerator control unit (S4b).

The refrigerator control unit receives the control command wirelessly transmitted from the Web pad, performs a control operation in response to the received control command and creates controlled result information (S5b).

Then, the refrigerator control unit wirelessly transmits the controlled result information to the Web pad (S6b).

The Web pad receives the controlled result information and displays it externally so that the user can monitor it (S7b).

For example, the user can monitor a varying refrigeration temperature and food state if the control command is a refrigeration associated command, and confirm a connected Web page picture if the control command is an Internet access command. Alternatively, where the control command is a home server function control command, the user can monitor the states of home appliances connected to a home network.

As apparent from the above description, the present invention provides a television-watchable refrigerator system and a method for operating the same, wherein a Web pad is detachably mounted on the outer surface of a refrigerator and a TV module or TV antenna module is disposed in the vicinity of a television set or television antenna terminal to receive a television signal from the television set or television antenna terminal and wirelessly transmit the received television signal to the Web pad, so that the television signal can be displayed through the Web pad. A user can watch television through the Web pad detachably mounted on the refrigerator even while moving about the room. Therefore, the present invention has the effect of improving the convenience of use and overcoming limitations regarding the installation location of the refrigerator.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

In particular, while a side-by-side refrigerator freezer is illustrated, the present invention also includes and is applicable to stand-alone refrigeration as well as vertically oriented refrigerator-freezer units. The present invention is also applicable to other home appliances.

What is claimed is:

1. A television-watchable refrigerator system comprising:
   a Web pad detachably mounted on an outer surface of a refrigerator, said Web pad receiving at least one of a refrigerator control command and a television control command inputted by a user;
   a refrigerator controller that displays a controlled result based on said refrigerator control command through said Web pad and controlling the operation of the refrigerator; and
   a television module connected with a television set, said television module receiving a television signal corresponding to said television control command from said television set, wirelessly transmitting the received television signal to said Web pad so that it can be displayed through said Web pad, and transferring said television control command input through said Web pad to said television set.

2. The television-watchable refrigerator system as set forth in claim 1, wherein said Web pad includes:
   an input unit for receiving said refrigerator control command or television control command inputted by the user;
   a refrigerator controller interface for wirelessly transmitting said refrigerator control command input through said input unit to said refrigerator controller and receiving said controlled result based on said refrigerator control command wirelessly transmitted from said refrigerator controller;

a wireless communication interface for wirelessly transmitting said television control command input through said input unit to said television module, wirelessly receiving said television signal corresponding to said television control command from said television module and processing the received television signal so that it is displayable; and a display unit for displaying said controlled result received by said refrigerator controller interface and said television signal processed by said wireless communication interface.

3. The television-watchable refrigerator system as set forth in claim 2, wherein said wireless communication interface includes:

a television signal receiver for receiving said television signal wirelessly transmitted from said television module;

a television signal processor for separating said television signal received by said television signal receiver into a video signal and an audio signal and transferring the separated video and audio signals to said display unit; and a control command-transmitter for wirelessly transmitting said television control command input through said input unit to said television module.

4. The television-watchable refrigerator system as set forth in claim 3, further comprising a remote controller for remotely inputting commands related to television watching, wherein said control command transmitter is configured to receive a television control command input from said remote controller and wirelessly transmit the received television control command to said television module.

5. The television-watchable refrigerator system as set forth in claim 1, wherein said television module includes:

a television connector connected with said television set for transmitting and receiving signals to and from said television set;

a control command receiver for receiving said television control command wirelessly transmitted from said Web pad and transferring it to said television set; and a television signal transmitter for wirelessly transmitting said television signal corresponding to said television control command from said television set to said Web pad.

6. A television-watchable refrigerator system comprising:

a Web pad detachably mounted on an outer surface of a refrigerator, said Web pad receiving at least one of a refrigerator control command and television control command input by a user;

a refrigerator controller that displays a controlled result based on said refrigerator control command through the Web pad and controlling the entire operation of the refrigerator; and a television antenna module connected to a television antenna terminal, said television antenna module receiving a television signal from said television antenna terminal, tuning to the received television signal in response to said television control command input through said Web pad and wirelessly transmitting the tuned television signal to said Web pad.

7. The television-watchable refrigerator system as set forth in claim 6, wherein said Web pad includes:

an input unit for receiving said refrigerator control command or television control command input by the user;

a refrigerator controller interface for wirelessly transmitting said refrigerator control command input through said input unit to said refrigerator controller and receiving said controlled result based on said refrigerator control command wirelessly transmitted from said refrigerator controller;

a wireless communication interface for wirelessly transmitting said television control command input through said input unit to said television antenna module, wirelessly receiving said television signal corresponding to said television control command from said television antenna module and processing the received television signal so that it is displayable; and a display unit for displaying said controlled result received by said refrigerator controller interface and said television signal processed by said wireless communication interface.

8. The television-watchable refrigerator system as set forth in claim 7, wherein said wireless communication interface includes:

a television signal receiver for receiving said television signal wirelessly transmitted from said television antenna module;

a television signal processor for separating said television signal received by said television signal receiver into a video signal and an audio signal and transferring the separated video and audio signals to said display unit; and a control command transmitter for wirelessly transmitting said television control command input through said input unit to said television antenna module.

9. The television-watchable refrigerator system as set forth in claim 8, wherein said television signal processor is adapted to decode a compressed/encoded television signal received by said television signal receiver.

10. The television-watchable refrigerator system as set forth in claim 8, further comprising a remote controller for remotely inputting commands related to television watching, wherein said control command transmitter is configured to receive a television control command inputted from said remote controller and wirelessly transmit the received television control command to said television antenna module.

11. The television-watchable refrigerator system as set forth in claim 6, wherein said television antenna module includes:

an antenna terminal connector connected to said television antenna terminal for receiving said television signal therefrom;

a control command receiver for wirelessly receiving said television control command from said Web pad;

a television tuner for tuning to said television signal received by said antenna terminal connector in response to said television control command received by said control command receiver; and a television signal transmitter for wirelessly transmitting said television signal tuned by said television tuner to said Web pad.

12. The television-watchable refrigerator system as set forth in claim 11, wherein said television antenna module further includes a digital compressor for compressing/encoding said television signal tuned by said television tuner.

13. The television-watchable refrigerator system as set forth in claim 12, further comprising a remote controller for remotely inputting commands related to television watching, wherein said television antenna module further includes a remote command receiver for receiving a television control command transmitted from said remote controller.

14. The television-watchable refrigerator system as set forth in claim 13, wherein said television antenna module further includes a tuner controller for controlling said television tuner in response to said television control command received by one of said control command receiver and said remote command receiver such that said television tuner performs tuning operation based on said television control command.

15. A method for operating a television-watchable refrigerator system, comprising:

detachably mounting a Web pad on an outer surface of a refrigerator and inputting at least one of a refrigerator control command and a television control command through the Web pad;

receiving a television signal from one of a television set and television antenna terminal in response to the input television control command and wirelessly transmitting the received television signal to the Web pad;

performing a signal separation/decoding operation with respect to the wirelessly transmitted television signal so that the television signal can be displayed through the Web pad; and displaying the displayable television signal through said Web pad.

16. The method as set forth in claim 15, wherein receiving includes compressing/encoding the television signal received from one of the television set and the television antenna terminal to enable rapid wireless transmission thereof.

17. The method as set forth in claim 15, further comprising:

wirelessly transmitting the input refrigerator control command to a refrigerator controller controlling the peration of the refrigerator;

performing a control operation in response to the wirelessly transmitted refrigerator control command and wirelessly transmitting the controlled result information to the Web pad; and displaying the wirelessly transmitted controlled result information through said Web pad.

* * * * *